(12) United States Patent
Mizutani et al.

(10) Patent No.: US 8,653,805 B2
(45) Date of Patent: Feb. 18, 2014

(54) DUTY RATIO/VOLTAGE CONVERSION CIRCUIT

(75) Inventors: Koichi Mizutani, Toyota (JP); Shoji Abo, Toyota (JP); Kouichi Yamanoue, Hiroshima (JP)

(73) Assignees: Toyota Jidosha Kabushiki Kaisha, Toyota (JP); Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 13/642,749

(22) PCT Filed: May 12, 2011

(86) PCT No.: PCT/IB2011/001005
§ 371 (c)(1),
(2), (4) Date: Oct. 22, 2012

(87) PCT Pub. No.: WO2011/144981
PCT Pub. Date: Nov. 24, 2011

(65) Prior Publication Data
US 2013/0057244 A1  Mar. 7, 2013

(30) Foreign Application Priority Data
May 21, 2010  (JP) ................ 2010-117672

(51) Int. Cl.
*H02M 3/156* (2006.01)
(52) U.S. Cl.
USPC ........................... 323/288; 363/39

(58) Field of Classification Search
USPC .............................. 323/282–288; 363/39–48
See application file for complete search history.

(56) References Cited

U.S. PATENT DOCUMENTS

| | | | |
|---|---|---|---|
| 3,117,243 A * | 1/1964 | Fahl | 327/276 |
| 6,172,633 B1 | 1/2001 | Rodgers et al. | |
| 6,369,558 B2 * | 4/2002 | Umemoto | 323/282 |
| 7,170,273 B2 * | 1/2007 | Sase et al. | 323/285 |
| 7,492,132 B2 * | 2/2009 | Kuroiwa et al. | 323/222 |
| 8,212,538 B2 * | 7/2012 | Nishida | 323/271 |
| 8,305,065 B2 * | 11/2012 | Sase et al. | 323/284 |

FOREIGN PATENT DOCUMENTS

| | | |
|---|---|---|
| JP | A-6-37641 | 2/1994 |
| JP | A-2003-249855 | 9/2003 |

* cited by examiner

*Primary Examiner* — Jessica Han
(74) *Attorney, Agent, or Firm* — Oliff PLC

(57) ABSTRACT

A duty ratio/voltage conversion circuit that converts the duty ratio of an input signal into voltage level and outputs the voltage level includes: an input terminal to which the input signal is input; a first CR integrating circuit that integrates the input signal; a load resistor a first end of which is connected to an output point of the first CR integrating circuit, and a second end of which is grounded; and an output terminal connected to the load resistor. The first CR integrating circuit includes a first pathway that has a first resistor, and a second pathway in which a phase inversion portion, a second resistor and a first capacitor are connected in series, and is a parallel circuit in which first and second ends of the first pathway are connected to first and second ends, respectively, of the second pathway.

18 Claims, 19 Drawing Sheets

DUTY RATIO=T1/T2

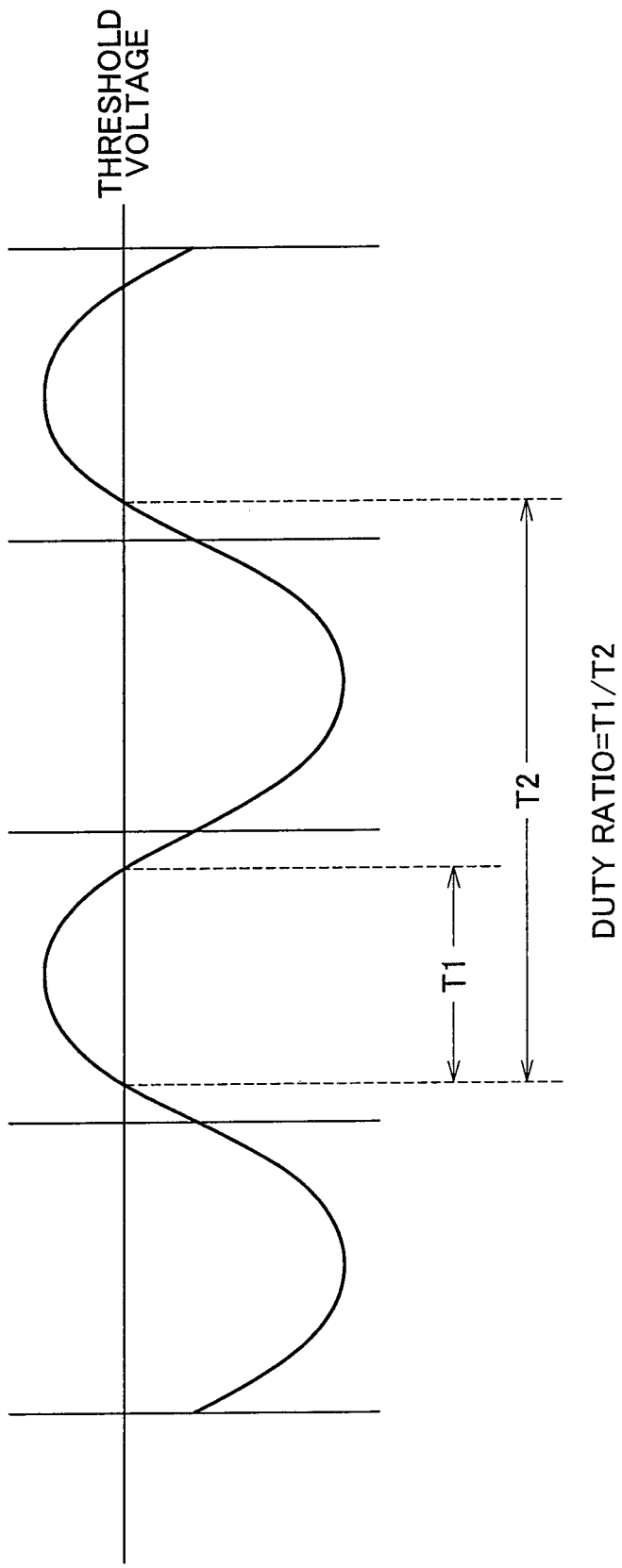

DUTY RATIO/VOLTAGE CONVERSION CIRCUIT

FIELD OF THE INVENTION

The invention relates to a duty ratio/voltage conversion circuit and, more particularly, to a low-cost and high-accuracy duty ratio/voltage conversion circuit that has a reduced ripple of output voltage and an improved response.

BACKGROUND OF THE INVENTION

As means for converting the duty ratio of a PWM signal into voltage, a CR filter (capacitor-resistor integrating circuit) that is high in conversion accuracy and is low in cost is often used (see FIG. 2). However, the existing CR filters are not able to achieve both a good output voltage response at the time of a change in the duty ratio and a reduction of the ripple voltage that is contained in the output voltage.

A technology related to the invention will be described in detail. As shown in FIG. 2, a duty ratio/voltage conversion circuit 201 that includes a CR filter (CR integrating circuit) 200 further includes a first resistor 203, a capacitor 204, and a second resistor 205 as component elements. The second resistor 205 is a load resistor that is connected to a connecting point between the first resistor 203 and the capacitor 204. The resistance value of the first resistor 203 and the capacitance of the capacitor 204 are not related to the average value of the voltage that is output. The average value of the voltage output from an output terminal 207 depends only on the duty ratio of an input signal. Therefore, the duty ratio/voltage conversion circuit 201 is able to highly accurately convert the duty ratio into voltage. However, in the duty ratio/voltage conversion circuit 201, the response time during which the output voltage changes in the event of a change in the duty ratio of the input signal and a pulsating component (i.e., ripple, which depends on the input frequency) of the output voltage occurring in the same event contradict with each other, giving rise to a problem of the ripple being inconveniently large in a use where high response speed is required. That is, the problem is that the response time can be shortened by lessening a time constant τ, but that if the time constant τ is lessened, the amplitude of the ripple becomes large.

In Japanese Patent Application Publication No. 6-37641 (JP-A-6-37641), FIG. 1 discloses a pulse width/voltage conversion circuit that is capable of converting a PWM signal into a voltage signal whose ripple is small in amount. This pulse width/voltage conversion circuit includes a first CR integrating circuit that integrates the PWM signal, analog switch means connected to an output of the first CR integrating circuit, and a second CR integrating circuit that is connected to the first CR integrating circuit when the switch means is on. The switch means is turned off for a period of a high level of the PWM signal, and is turned on for a period of a low level of the PWM signal.

The pulse width/voltage conversion circuit outputs as a final converted voltage an average value of the voltage during the period of the low level of the PWM signal which is held by the second CR integrating circuit. However, the average voltage of the entire PWM signal (covering the period of the high level of the signal and the period of the low level of the signal) is greater than the average voltage during the low-level period. Therefore, this pulse width/voltage conversion circuit has a problem in which the duty ratio of the PWM signal cannot be directly reflected on the output voltage (i.e., there arises an error in comparison with the case where the duty ratio is directly reflected). The size of the error can be lessened by a certain degree by increasing the time constant of the first CR integrating circuit. However, this involves a problem in which the follow-up of the output voltage delays when the duty ratio of the PWM signal changes. Besides, when the duty ratio is 100% (continuously at the high level), another problem arises in which the output voltage of the second CR integrating circuit becomes unstable because of an input terminal thereof being open, while the output voltage of the first CR integration circuit becomes maximum. The other embodiments disclosed in Japanese Patent Application Publication No. 6-37641 (JP-A-6-37641) have substantially the same problems as described above, and also have a problem of increase of the number of component parts.

SUMMARY OF THE INVENTION

The invention provides a low-cost, high-accuracy duty ratio/voltage conversion circuit whose output voltage ripple is reduced and whose response is improved.

An aspect of the invention relates to a duty ratio/voltage conversion circuit that converts a duty ratio of an input signal into a voltage level and outputs the voltage level. This duty ratio/voltage conversion circuit includes: an input terminal to which the input signal is input; a first CR integrating circuit that integrates the input signal from the input terminal; a load resistor a first end of which is directly or indirectly connected to an output point of the first CR integrating circuit, and a second end of which is grounded; and an output terminal connected to the load resistor. The first CR integrating circuit includes a first pathway that has a first resistor, and a second pathway that has a phase inversion portion, a second resistor and a first capacitor that are connected in series, and the first CR integrating circuit is a parallel circuit in which a first end and a second end of the first pathway are connected to a first end and a second end, respectively, of the second pathway, and a connecting point between the first end of the first pathway and the first end of the second pathway is connected to the input terminal, and a connecting point between the second end of the first pathway and the second pathway of the second pathway is the output point of the first CR integrating circuit.

According to the foregoing duty ratio/voltage conversion circuit, in a low-frequency region of the input signal, the output impedance of the first CR integrating circuit is lessened, and the voltage that occurs across the load resistor becomes high (the low-frequency gain becomes large), in comparison with the related-art duty ratio/voltage conversion circuit. Hence, in comparison with the related-art duty ratio/voltage conversion circuit, the response of the output voltage at the time of a change of the duty ratio of the input signal can be improved in the foregoing duty ratio/voltage conversion circuit of the invention. Besides, in comparison with the related-art duty ratio/voltage conversion circuit, the output impedance of the first CR integrating circuit becomes large in the high-frequency region of the input signal, and therefore a high-frequency component of the input signal is less apt to pass through the circuit (the high-frequency gain lessens) in the duty ratio/voltage conversion circuit of the invention. Hence, the ripple of the output voltage can be lessened. Besides, since the duty ratio/voltage conversion is performed both during a high-level period of the input signal and during a low-level period of the input signal, the duty ratio/voltage conversion circuit of the invention is able to perform a highly accurate conversion in which the duty ratio is accurately reflected. Besides, due to the relatively simple construction, the foregoing aspect of the invention provides a low-cost duty ratio/voltage conversion circuit.

The phase inversion portion, the second resistor and the first capacitor in the second pathway may be connected in series in the recited order from the input terminal.

According to this construction, the phase of the input signal is inverted in the second pathway, and the phase-inverted signal is led to the first capacitor. Therefore, the signal led to the first capacitor via the first pathway and the signal led to the first capacitor via the second pathway are opposite in phase, so that electric charges are certainly accumulated in the first capacitor.

The load resistor may be a second CR integrating circuit that integrates a signal sent from the output point.

According to this construction, the signal input to the second CR integrating circuit is averaged (flattened). Therefore, stable output voltage can be obtained from the output terminal.

The second CR integrating circuit may include a third resistor a first end of which is connected to the output point, and a second capacitor a first end of which is connected to a second end of the third resistor, and a second end of which is grounded, and a connecting point between the third resistor and the second capacitor is connected to the output terminal.

According to this construction, stable output voltage can be more certainly obtained from the output terminal.

An N stage(s) (N is an arbitrary integer equal to or greater than 1) of third CR integrating circuits may be connected to the second CR integrating circuit as stages that succeed to the second CR integrating circuit, and a first end of the third CR integrating circuit that is of the first stage in an order of connection from a side of the input terminal may be connected to a connecting point between the third resistor and the second capacitor of the second CR integrating circuit, and a first end of the capacitor of the third CR integrating circuit of the first stage in the order of connection from the side of the input terminal may be connected to a second end of the third CR integrating circuit of the first stage in the order of connection from the side of the input terminal, and a second end of the capacitor of the third CR integrating circuit of the first stage in the order of connection from the side of the input terminal may be grounded, and a first end of the resistor of each one of the third CR integrating circuits of the second and succeeding stages in the order of connection may be connected to a connecting point between the resistor and the capacitor of a preceding one of the third CR integrating circuits, and a first end of the capacitor of each one of the third CR integrating circuits of the second and succeeding stages may be connected to a second end of the resistor of the third CR integrating circuit of the same stage, and a second end of the capacitor of each one of the third CR integrating circuits of the second and succeeding stages may be grounded.

According to this construction, the signal is averaged (flattened) by the second CR integrating circuit and the third CR integrating circuit. Therefore, more stable output voltage can be obtained from the output terminal.

The output terminal may be connected to the connecting point between the resistor and the capacitor of the third CR integrating circuit positioned at a terminal stage in the order of connection, of the N stage(s) of the third CR integrating circuits.

According to this construction, stable output voltage can be more certainly obtained from the output terminal.

A first end of the load resistor may be connected to the output point via an M stage(s) (M is an arbitrary integer equal to or greater than 1) of fourth CR integrating circuits, and each of the fourth CR integrating circuits may be connected to the first capacitor in parallel, and each fourth CR integrating circuit may have a construction in which a capacitor is connected between resistors in series, and a first end of the load resistor may be connected to a connecting point between the capacitor and one of the resistors f the fourth CR integrating circuit positioned at a terminal stage, of the M stage(s) of the fourth CR integrating circuits.

According to this construction, in comparison with the related-art duty ratio/voltage conversion circuit, the output impedances of the first CR integrating circuit and the fourth CR integrating circuits become large in the high-frequency region of the input signal, and therefore a high-frequency component of the input signal is less apt to pass through the circuit (the high-frequency gain lessens). Besides, this construction, in comparison with the foregoing basic construction of the first aspect of the invention, has an increased output impedance due to the output impedance of the fourth CR integrating circuit in the high-frequency region of the input signal, and therefore is even less apt to allow passage of the high-frequency component of the input signal (has an even less high-frequency gain). Therefore, the ripple of the output voltage can be further lessened.

A fifth CR integrating circuit may be connected to an intermediate portion of the first pathway, and a sixth CR integrating circuit may be connected to an intermediate portion of the second pathway, and a first end of a resistor of the fifth CR integrating circuit may be connected to the input terminal, and a second end of the resistor of the fifth CR integrating circuit may be connected to a first end of the first resistor, and a first end of a capacitor of the fifth CR integrating circuit may be connected to a connecting portion between the resistor of the fifth CR integrating circuit and the first resistor, and a second end of the capacitor of the fifth CR integrating circuit may be grounded, and a first end of a resistor of the sixth CR integrating circuit may be connected to an output side of the phase inversion portion, and a second end of the resistor of the sixth CR integrating circuit may be connected to a first end of the second resistor, and a first end of a capacitor of the sixth CR integrating circuit may be connected to a connecting portion between the resistor of the sixth CR integrating circuit and the second resistor, and a second end of the capacitor of the sixth CR integrating circuit may be grounded.

According to this construction, due to the provision of the fifth CR integrating circuit and the sixth CR integrating circuit, even if the input signal has a rectangular waveform, the signals sent output by the fifth CR integrating circuit and the sixth CR integrating circuit have a form of gentle rise and gentle fall. Due to this, even if a time delay occurs in the output signal of the phase inversion portion, it is possible to restrain the appearance of the spike waveform in the sum of the output signal of the first pathway and the output signal of the second pathway (a multiplexed signal at the output point).

According to the duty ratio/voltage conversion circuit in accordance with the foregoing aspect of the invention, it is possible to provide a low-cost and high-accuracy duty ratio/voltage conversion circuit that has a lessened ripple of output voltage and an improved response, in comparison with the related-art duty ratio/voltage conversion circuit.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 17A shows a waveform of the input signal, and FIG. 17B shows a state in which the input signal is inverted by a phase inversion portion, and FIG. 17C shows a multiplexed signal at the output point in the other embodiment, and FIG. 17D shows a multiplexed signal at the output point in the fifth embodiment in the case where the signal as shown in FIG. 17A is processed by a fifth CR integrating circuit and the signal as shown in FIG. 17B is processed by a sixth CR integrating circuit;

FIG. 18 is a diagram showing the case where the input signal is a sine-wave signal.

DETAILED DESCRIPTION OF THE EMBODIMENTS

Figure 1:
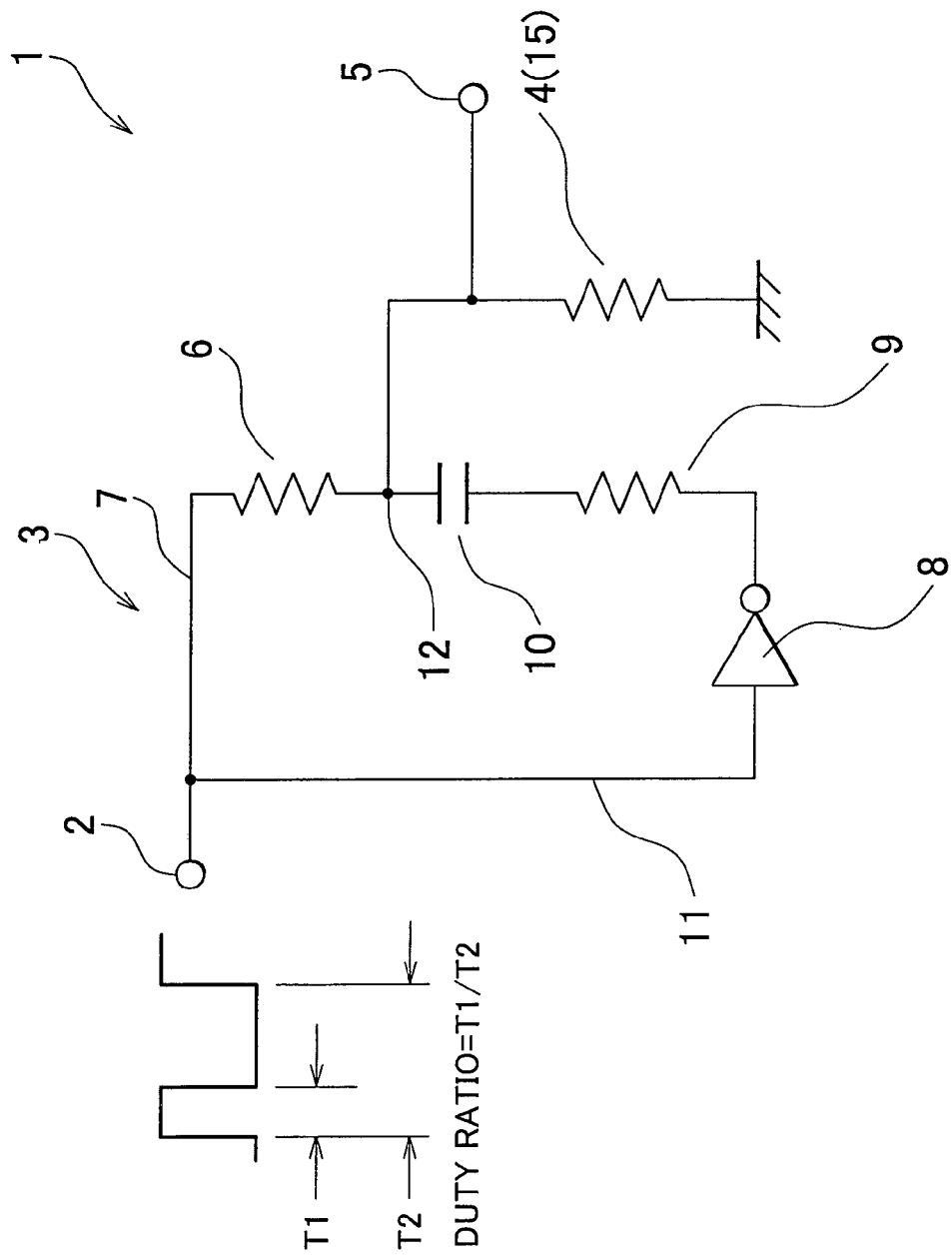
FIG. 1 is a diagram showing a duty ratio/voltage conversion circuit in accordance with a first embodiment of the invention.

[FIRST EMBODIMENT] A first embodiment of the invention will be described with reference to the accompanying drawings. FIG. 1 is a diagram showing a duty ratio/voltage conversion circuit in accordance with the first embodiment.

The duty ratio/voltage conversion circuit (hereinafter, simply referred to as "voltage conversion circuit") 1 in accordance with the embodiment is a circuit that converts the duty ratio of an input signal (PWM signal) into a level of voltage, and outputs the level of voltage.

The voltage conversion circuit 1 includes an input terminal 2, a first CR (capacitor-resistor) integrating circuit 3, a load resistor 4, and an output terminal 5.

The input terminal 2 is a terminal to which the input signal (PWM signal) is input.

A first CR integrating circuit 3 integrates the input signal that is input via the input terminal 2. The first CR integrating circuit 3 includes a first pathway 7 that has a first resistor 6, and a second pathway 11 in which a phase inversion portion 8, a second resistor 9 and a first capacitor 10 are connected in series. The first CR integrating circuit is a parallel circuit in which a first end and a second end of the first pathway 7 are connected to a first end and a second end, respectively, of the second pathway 11. In the first CR integrating circuit 3, a connecting point between the first end of the first pathway 7 and the first of the second pathway 11 is connected to the input terminal 2, and a connecting point between the second end of the first pathway 7 and the second end of the second pathway 11 is used as an output point 12. In the second pathway 11, the phase inversion portion 8, the second resistor 9 and the first capacitor 10 are connected in series in that order of mention from the side of the input terminal 2.

A first end of the load resistor 4 is connected to the output point 12 of the first CR integrating circuit 3, and a second end thereof is grounded. In the example construction shown in FIG. 1, the load resistor 4 is provided as a third resistor 15. That is, the first end of the third resistor 15 is connected to the output point 12, and the second end thereof is grounded. Incidentally, the form of the load resistor 4 can be modified, which will be described later in conjunction with a second embodiment and the like.

The output terminal 5 is connected to the load resistor 4 (third resistor 15). In the example construction shown in FIG. 1, the output terminal 5 is connected to the foregoing first end of the third resistor 15.

Figure 2:
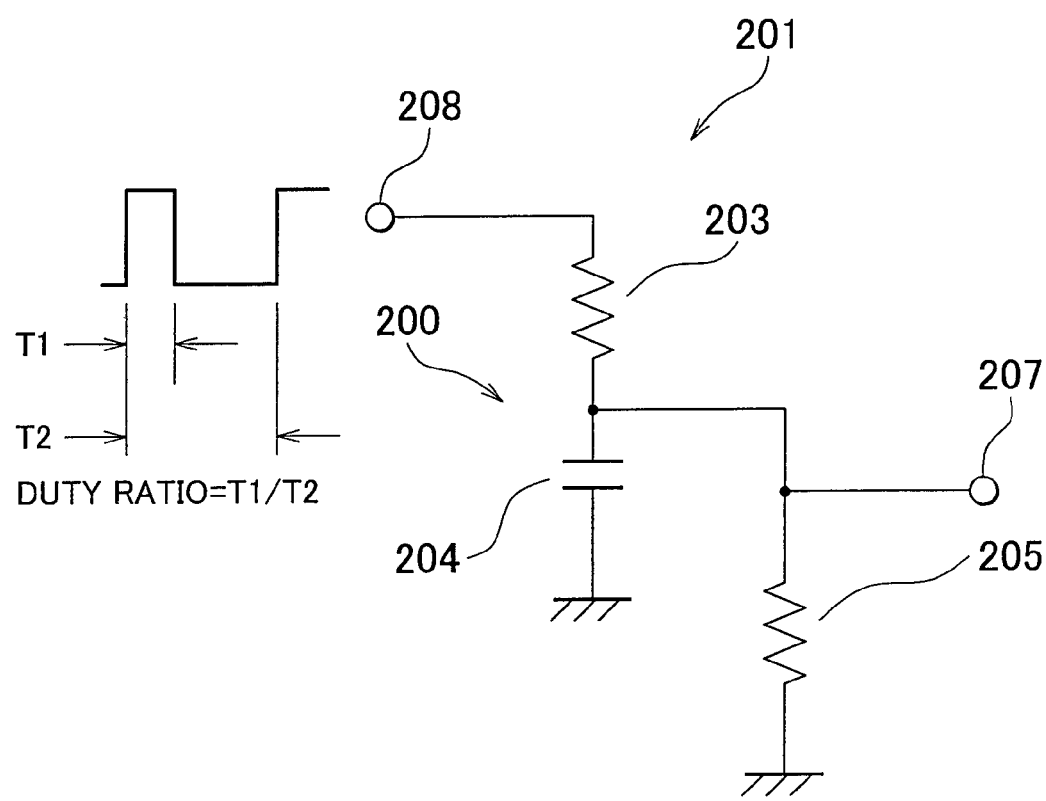
FIG. 2 is a diagram showing an example of a voltage conversion circuit in accordance with the related art.

Next, operation of the voltage conversion circuit 1 will be described by taking the circuit shown in FIG. 1 as an example. To make effects of the embodiment easier to understand, the following description will be made in parallel with a related-art voltage conversion circuit. FIG. 2 is a diagram showing an example of the related-art voltage conversion circuits.

A voltage conversion circuit 20 in accordance with the related art includes a first CR integrating circuit 200, and a second resistor 205 as a load resistor, as shown in FIG. 2. The first CR integrating circuit 200 includes a first resistor 203 connected at a first end thereof to an input terminal 203, and a first capacitor 204 that is connected at a first end thereof to a second end of the first resistor 203, and that is grounded at a second end thereof. A first end of the second resistor 205 is connected to a connecting point between the first resistor 203 and the first capacitor 204, and a second end of the second resistor 205 is grounded. The first end of the second resistor 205 is connected to an output terminal 207. The resistance of the first resistor 203 is $R_1$ (Ω), and the resistance of the second resistor 205 is $R_2$ (Ω).

On the other hand, in the voltage conversion circuit 1 in accordance with the embodiment, the resistance of the first resistor 6 is $R_x$ (Ω), where $R_x = R_1/2$. The resistance of the second resistor 9 is also $R_x$ (Ω). The capacitance of the first capacitor 10 of the voltage conversion circuit 1 is equal to the capacitance of the first capacitor 204 of the related art. Besides, the resistance of the third resistor 15 of the voltage conversion circuit 1 is $R_2$ (Ω), which is equal to the resistance of the second resistor 204 of the related art. Due to the foregoing setting of the resistances and the capacitances, the voltage conversion circuit 1 of the embodiment and the voltage conversion circuit 201 of the related art are substantially equal in cut-off frequency.

Figure 3:
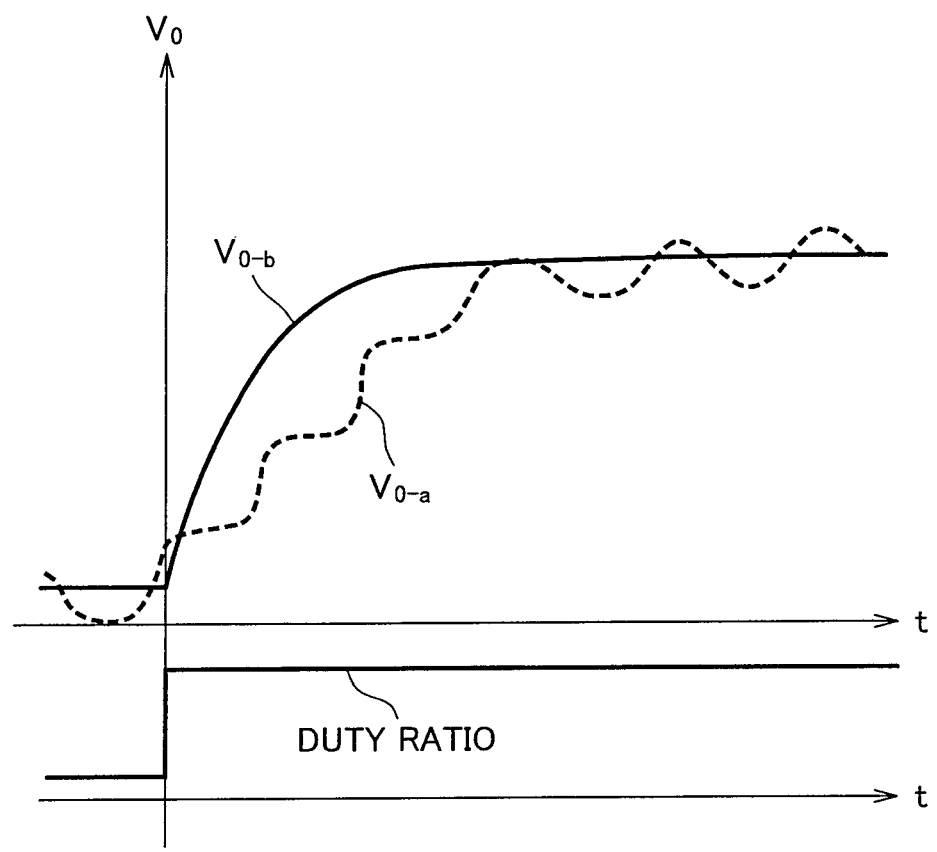
FIG. 3 is a schematic diagram showing comparison between the output voltage in the first embodiment and the output voltage in the related art.

Firstly, a low-frequency component of the input signal will be considered. For easier understanding, an input signal (direct current) having a frequency of 0 Hz is assumed. If the frequency of the input signal is 0 Hz, the impedance of the first capacitor 10 is infinitely large in the embodiment, so that the output impedance of the first CR integrating circuit 3 is $R_x (=R_1/2)$ (Ω). On the other hand, in the related art, if the frequency of the input signal is 0 Hz, the impedance of the first capacitor 204 is infinitely large, so that the output impedance of the first CR integrating circuit 200 is $R_1$ (Ω). That is, the output impedance of the first CR integrating circuit 3 in the embodiment is ½ of the output impedance of the first CR integrating circuit 200 in the related art. Herein, when the partial voltage of the first resistor 6 and the third resistor 15 in the embodiment and the partial voltage of the first resistor 203 and the second resistor 205 in the related art is considered, the voltage across the third resistor 15 in the embodiment is higher than the voltage across the second resistor 205 in the related art in a low-frequency region (i.e., the low-frequency gain is higher in the embodiment than in the related art). Hence, when the duty ratio of the input PWM signal, the embodiment has better response of the output voltage. FIG. 3 is a schematic diagram showing comparison between the output voltage in the embodiment and the output voltage in the related art. From the illustration in FIG. 3, it can be understood that a curve Vo-b of the output voltage in the embodiment is better than a curve Vo-a of the output voltage in the related art in terms of the response of the output voltage when the duty ratio of the input signal changes.

Next, a high-frequency component of the input signal will be considered. This high-frequency component is a component whose frequency is sufficiently higher than the cut-off frequency. As for the high-frequency component of the input signal, in the embodiment, the impedance of the first capacitor 10 is 0 (Ω), and the output impedance of the first CR integrating circuit 3 is $R_x/2$ (Ω) if the output resistance of the output resistance of the phase inversion portion 8 is 0. On the other hand, in the related art, the impedance of the first capacitor 204 is 0 (Ω), and due to its influence, the output impedance of the first CR integrating circuit 200 is near 0 (Ω). When the output impedance of the first CR integrating circuit 3 and the partial voltage of the third resistor 15 in the embodiment and the output impedance of the first CR integrating circuit 200 and the partial voltage of the second resistor 205 in the related art are taken into consideration, the voltage across the third resistor 15 in the embodiment is lower than the voltage across the second resistor 205 in the related art within a high-frequency region (i.e., the embodiment is higher in the high frequency gain than the related art). Hence, in the embodiment, the high-frequency component is apt to attenuate, and the amplitude of the ripple of the output signal is correspondingly small. From FIG. 3, it can be understood that a curve Vo-b of the output voltage in the embodiment is smaller in the ripple of output voltage than a curve Vo-a of the output voltage in the related art.

Hence, according to the embodiment, the ripple of the output voltage can be lessened and the response can be improved, in comparison with the duty ratio/voltage conversion circuit according to the related art. Besides, the duty ratio/voltage conversion is performed both during the high-level period of the input signal and during the low-level period thereof, so that it is possible to perform a high-accuracy conversion in which the duty ratio is accurately reflected. Besides, because of the relatively simple construction, the embodiment provides a low-cost duty ratio/voltage conversion circuit.

Figure 4:
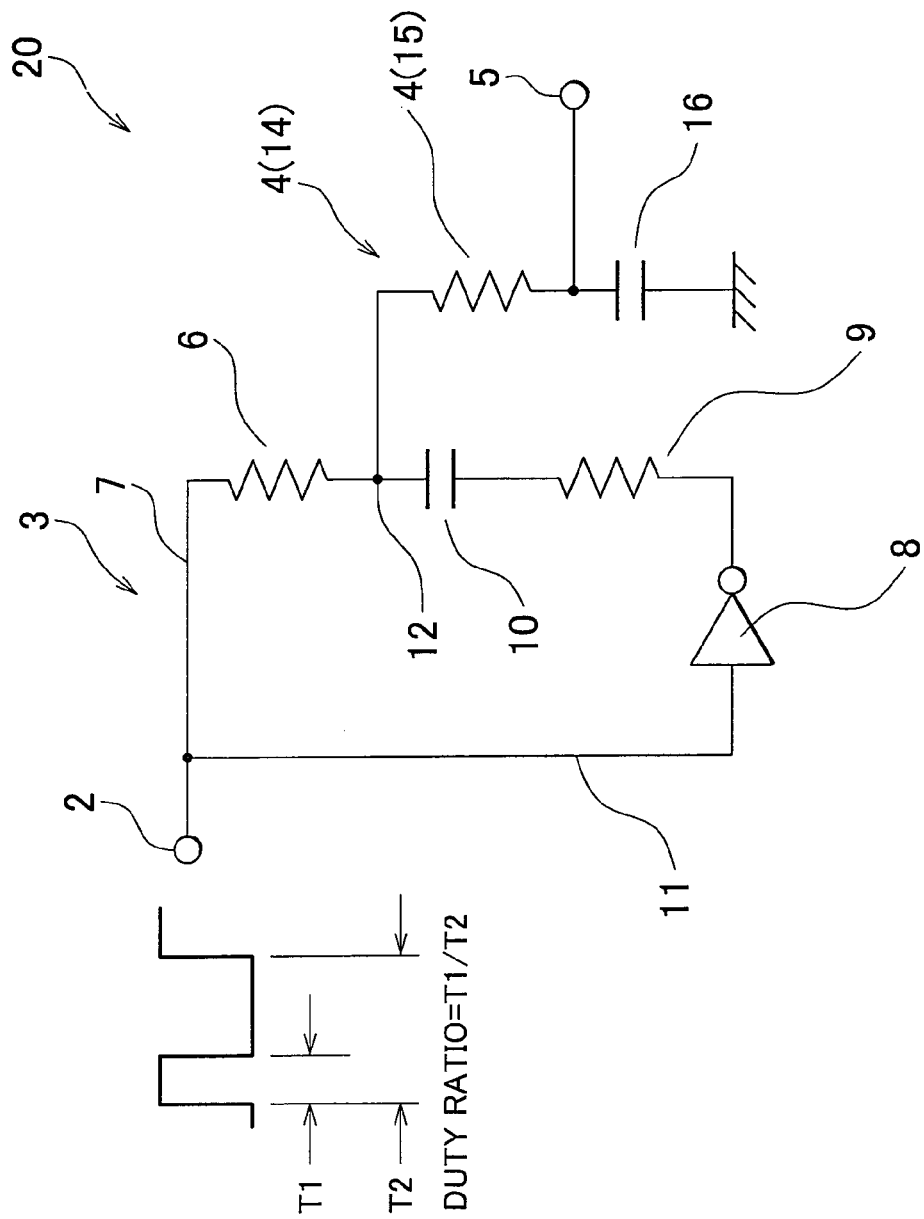
FIG. 4 is a diagram showing a duty ratio/voltage conversion circuit in accordance with a second embodiment of the invention.

[SECOND EMBODIMENT] A second embodiment of the invention will be described the drawings. FIG. 4 is a diagram showing a duty ratio/voltage conversion circuit in accordance with the second embodiment.

A duty ratio/voltage conversion circuit 20 in accordance with the second embodiment is different from the circuit of the first embodiment in the configuration of a load resistor 4, while in terms of other constructions the circuit 20 is substantially the same as the circuit of the first embodiment. While in the first embodiment the load resistor 4 is a simple resistor, the load resistor 4 in the second embodiment is a second CR integrating circuit 14 that integrates a signal from an output point 12. The second CR integrating circuit 14 includes a third resistor 15 that is connected at a first end thereof to the output point 12, and a second capacitor 16 that is connected at a first end thereof to a second end of the third resistor 15. A connecting point between the third resistor 15 and the second capacitor 16 is connected to an output terminal 5.

Figure 5:
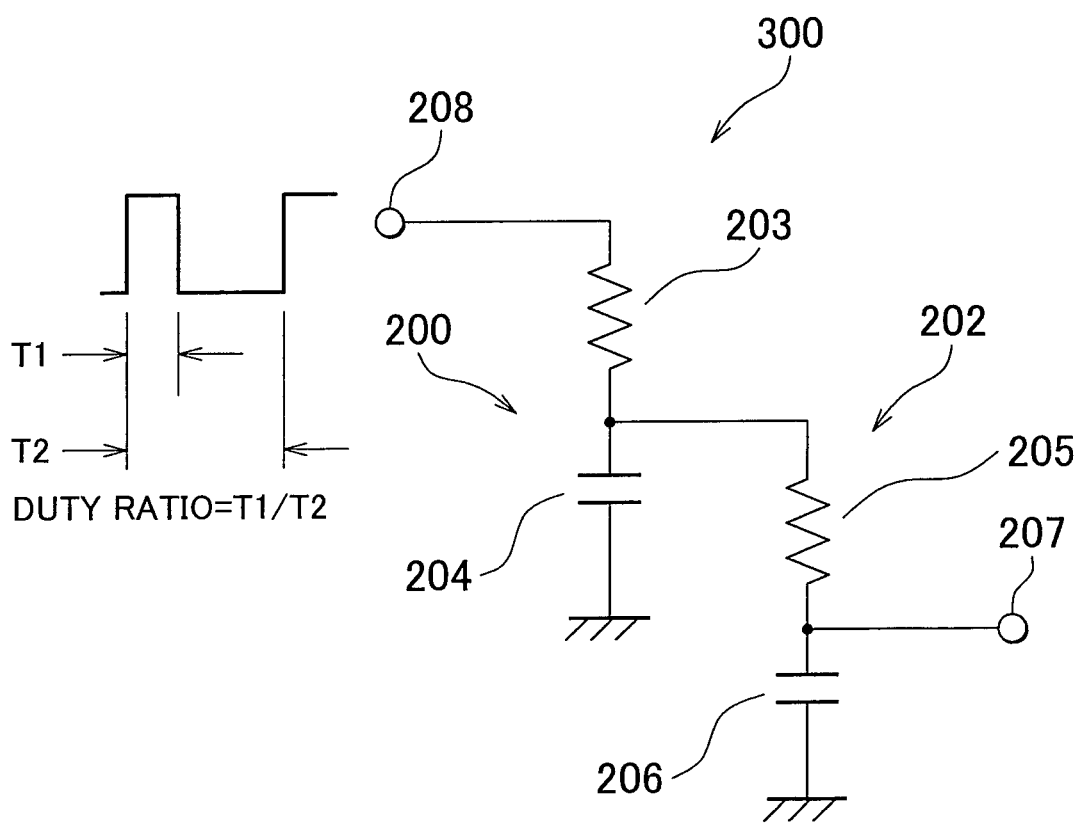
FIG. 5 is a diagram showing a duty ratio/voltage conversion circuit in accordance with the related art.
Figure 6:
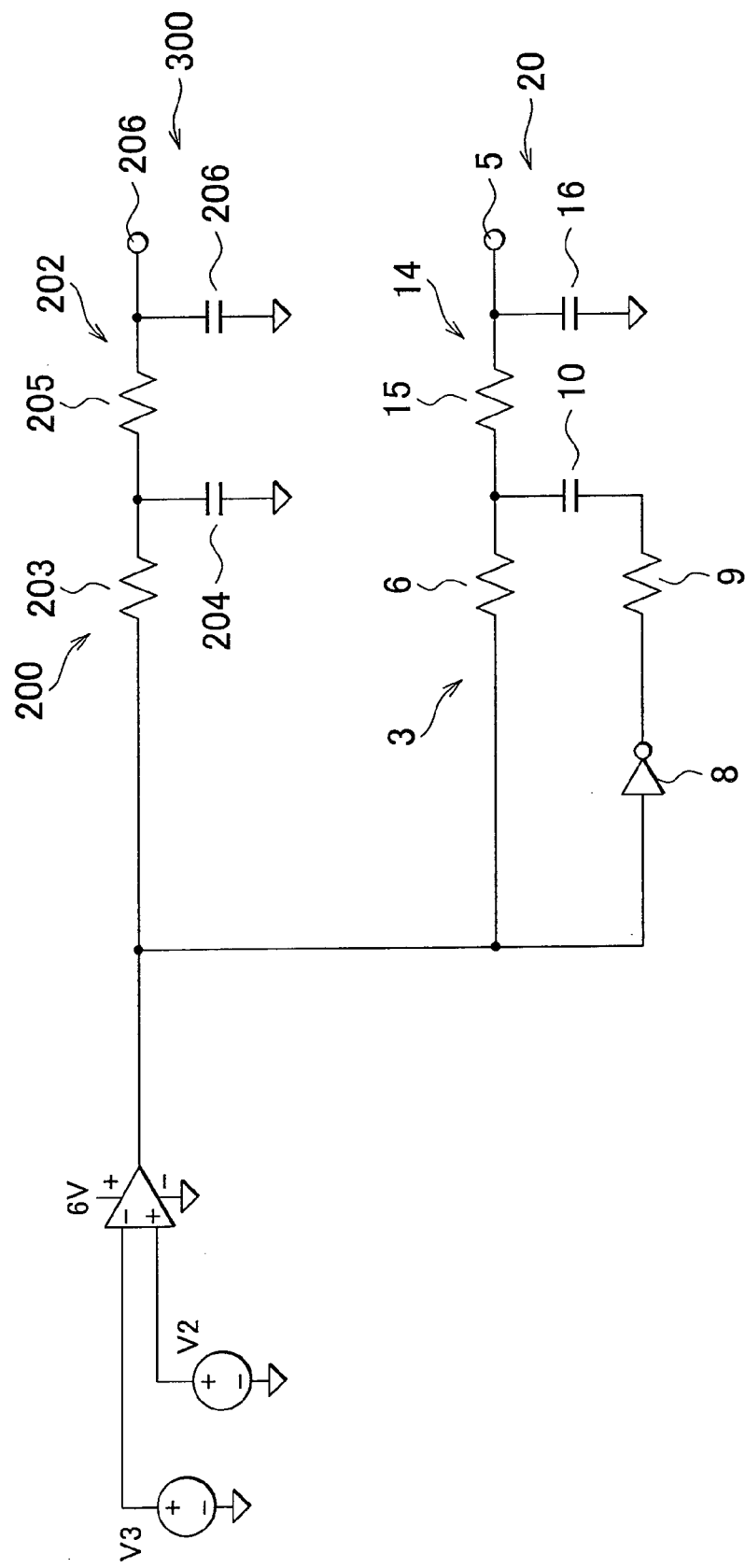
FIG. 6 is a diagram showing a construction in which the related-art duty ratio/voltage conversion circuit and the duty ratio/voltage conversion circuit of the second embodiment are connected in parallel with each other to a signal input portion.
Figure 7:
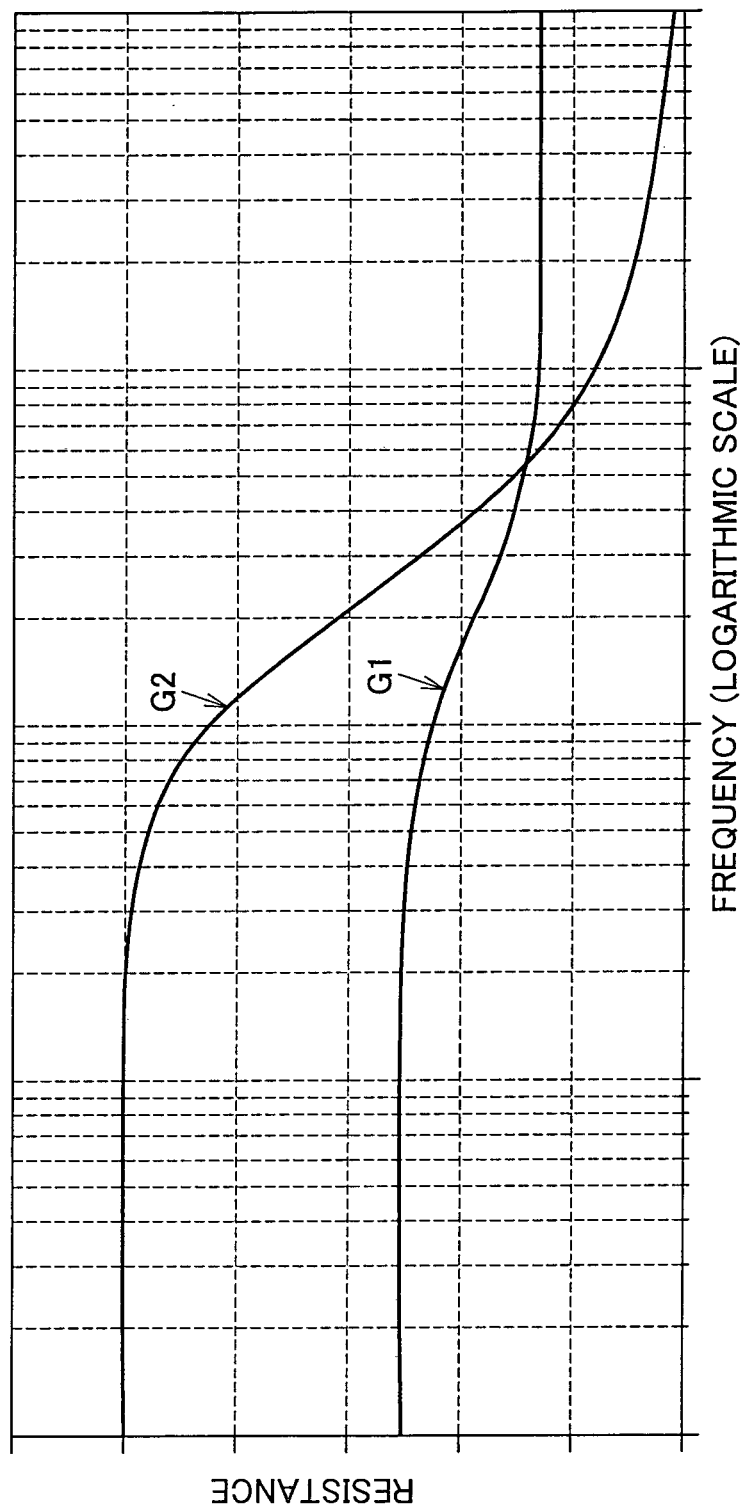
FIG. 7 is a diagram showing comparison between the output impedance of a first CR integrating circuit in the related art and the output impedance of a first CR integrating circuit in the second embodiment.
Figure 8:
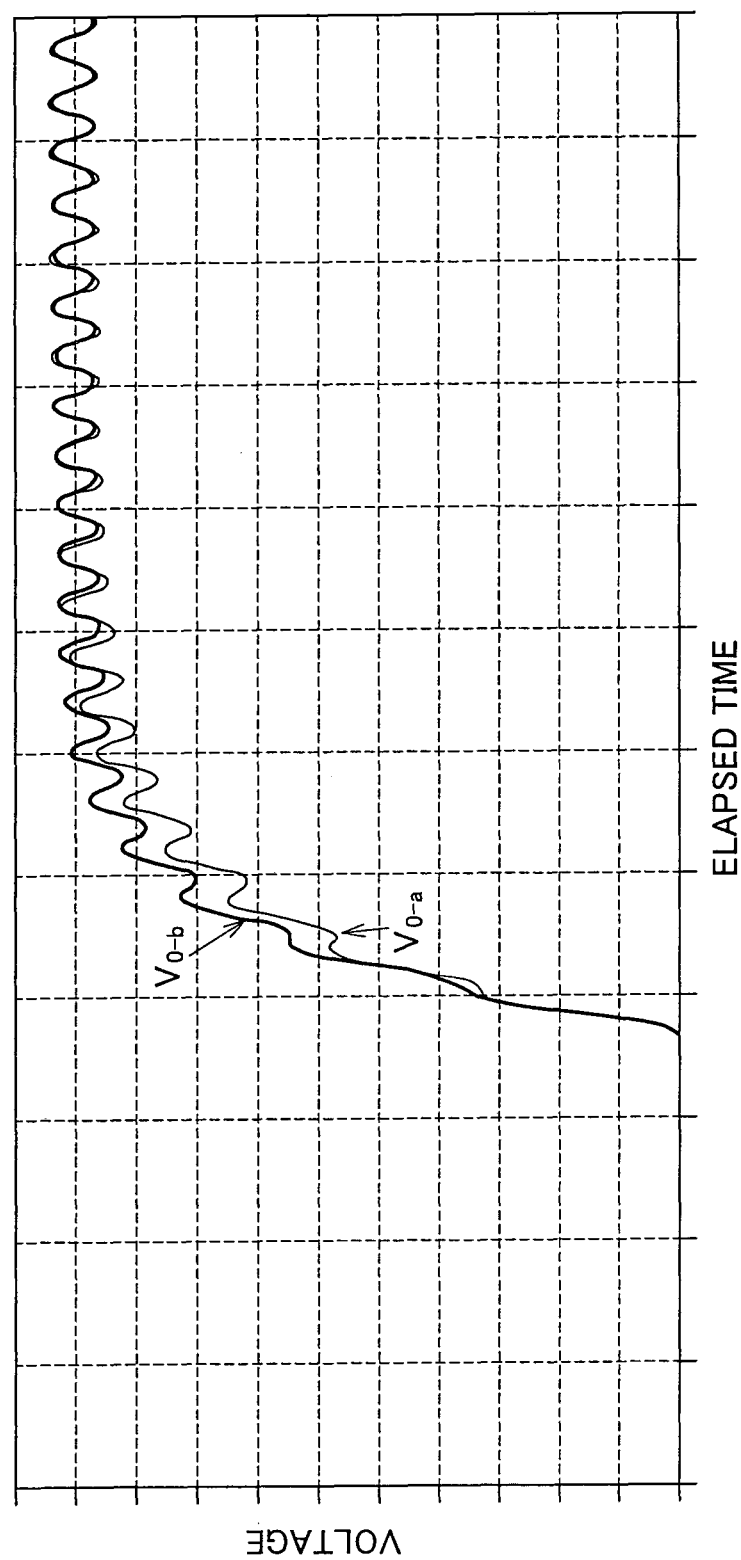
FIG. 8 is a diagram showing comparison between the output voltage of the voltage conversion circuit in accordance with the related art and the output voltage of the voltage conversion circuit of the second embodiment.

The second embodiment is capable of achieving substantially the same effects as the first embodiment. The effects of the second embodiment will be described with reference to FIGS. 5 to 10. FIG. 5 is a diagram showing a duty ratio/voltage conversion circuit in accordance with the related art. FIG. 6 is a diagram showing a construction in which the related-art duty ratio/voltage conversion circuit (hereinafter, referred to simply as "voltage conversion circuit") and the duty ratio/voltage conversion circuit (hereinafter, referred to simply as "voltage conversion circuit") of the embodiment are connected in parallel with each other to a signal input portion. FIG. 7 is a diagram showing comparison between the output impedance of the first CR integrating circuit in the related art and the output impedance of the first CR integrating circuit in the embodiment. FIG. 8 is a diagram showing comparison between the output voltage of the voltage conversion circuit of the related art and the output voltage of the voltage conversion circuit of the embodiment.

The related-art voltage conversion circuit 300 shown in FIG. 5 is different from the related-art circuit 200 shown in FIG. 2 in that the second resistor 205 of the related art shown in FIG. 2 is replaced by a second CR integrating circuit 202 while other constructions are the same as those of the related-art circuit shown in FIG. 2. In the related-art circuit 300 shown in FIG. 5, the second CR integrating circuit 202 includes a second resistor 205 that is connected at a first end thereof to an output point of a first CR integrating circuit 204, and a second capacitor 206 that is connected at a first end thereof to a second end of the second resistor 205 and that is grounded at a second end thereof. A connecting point between the second resistor 205 and the second capacitor 206 is connected to an output terminal 207.

A reason why in FIG. 6, the related-art voltage conversion circuit 300 and the voltage conversion circuit 20 of the embodiment are connected in parallel is to input the same input signal to the related-art circuit and to the circuit of the embodiment. The output voltage obtained when a PWM signal is input from a signal input portion in FIG. 6 will be considered.

In FIG. 7, the output impedance of the first IC integrating circuit 3 in the voltage conversion circuit 20 of the embodiment is as shown by a curve G1 by substantially the same principle as in the first embodiment. On the other hand, in the related-art voltage conversion circuit 300, the output impedance of the first integrating circuit 200 is as shown by a curve G2. As can be seen from the curves G1 and G2, in the low-frequency region, the output impedance is lower in the voltage conversion circuit 20 of the embodiment than in the related-art voltage conversion circuit 300. Besides, in the high-frequency region, the output impedance is higher in the voltage conversion circuit 20 of the embodiment than in the related-art voltage conversion circuit 300. Hence, the embodiment is higher in the low-frequency gain and lower in the high-frequency gain than the related art. Because of this, the second embodiment is able to achieve substantially the same effects as the first embodiment. FIG. 8 is a diagram showing comparison between the output voltage in the embodiment and the output voltage in the related art. From the diagram in FIG. 8, it can be understood that a curve Vo-b of the output voltage in the embodiment is better than a curve Vo-a of the output voltage in the related art in terms of the response of the output voltage when the duty ratio of the input signal changes. Incidentally, although in the diagram shown in FIG. 8, the embodiment and the related art do not seem to be much different in the amplitude of the ripple, the difference therebetween in the amplitude of the ripple can be enlarged by appropriately setting the resistance, the capacitance, etc.

Figure 9:
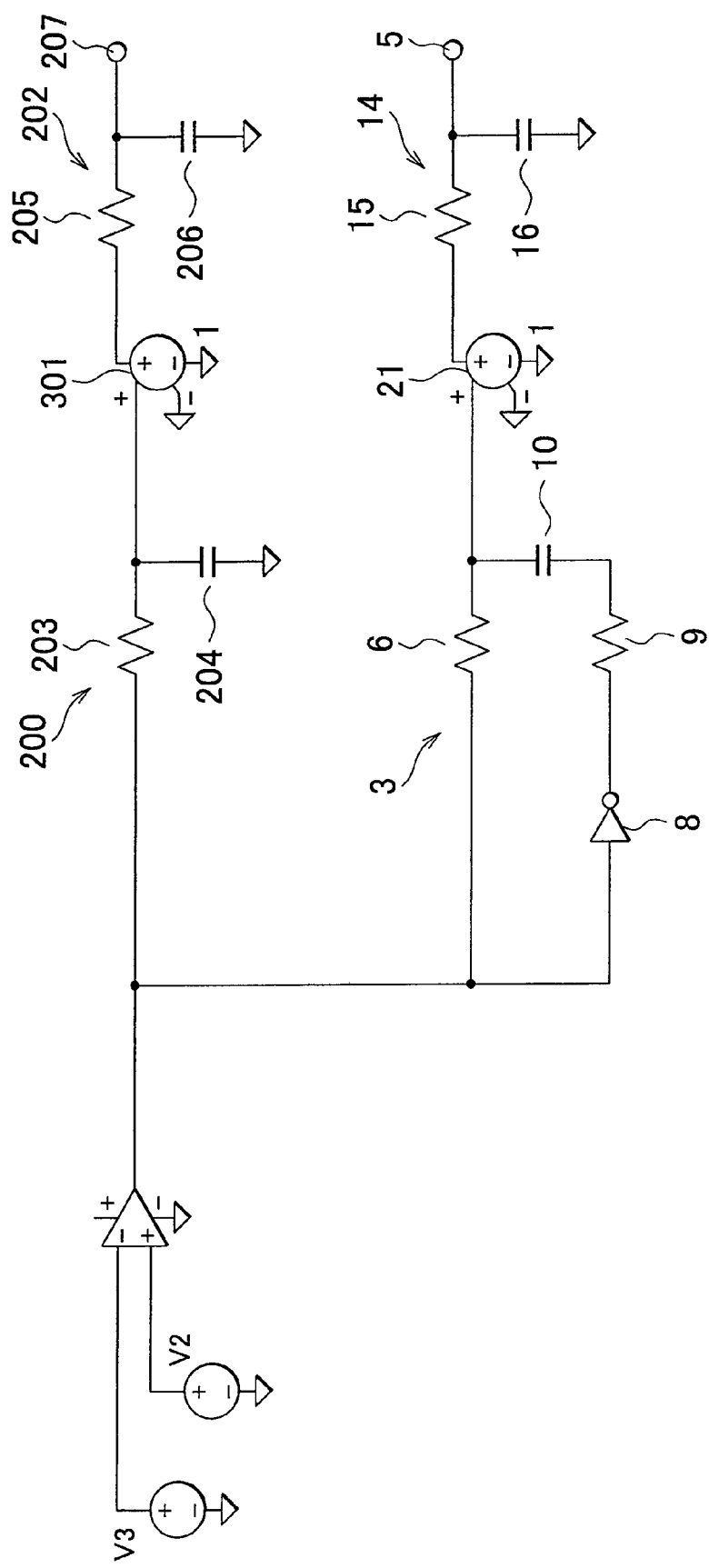
FIG. 9 is a diagram showing a construction in which an ideal amplifier having a gain ratio of 1 is interposed between the first CR integrating circuit and a second CR integrating circuit in each of the voltage conversion circuits shown in FIG. 6.
Figure 10:
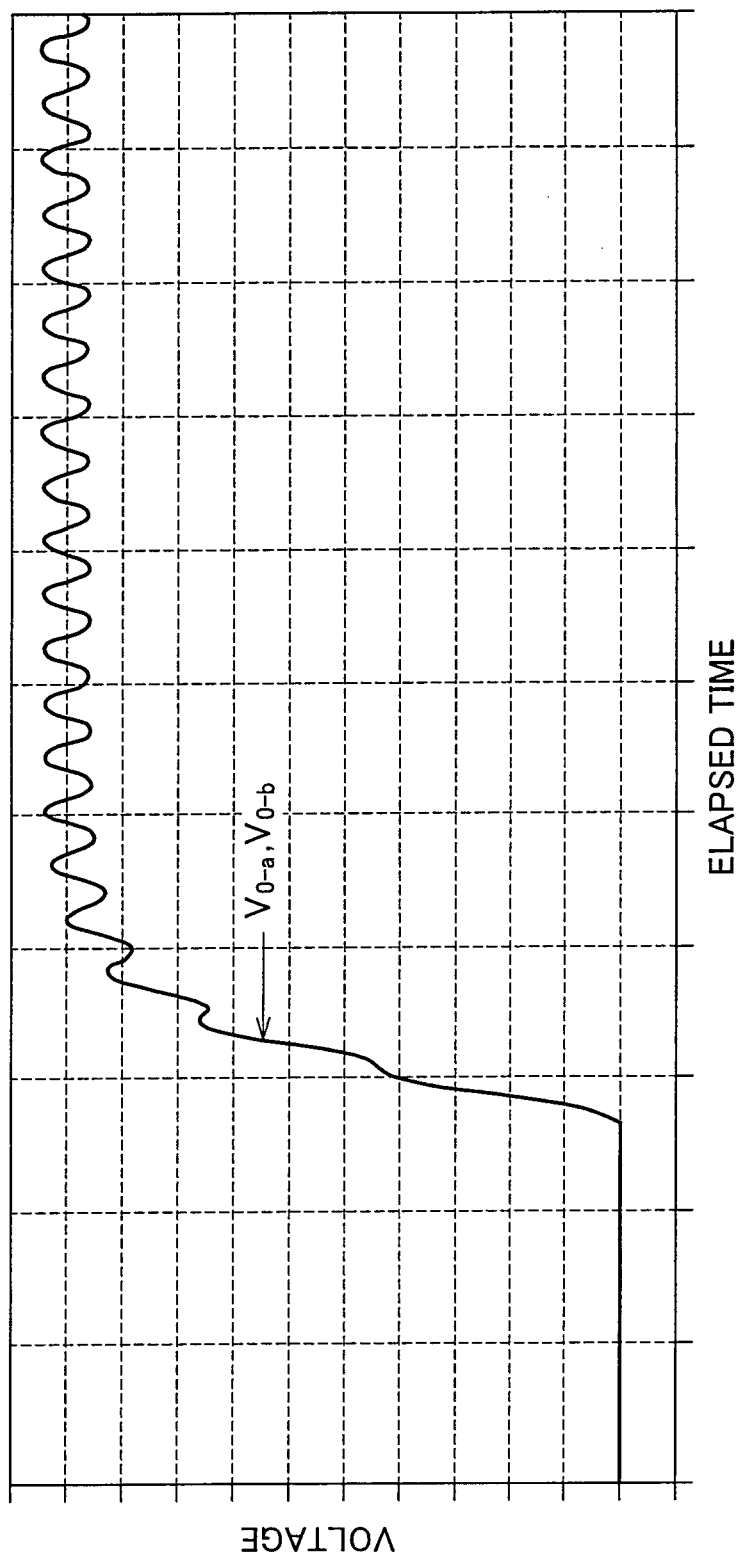
FIG. 10 is a diagram showing the output voltages of the duty ratio/voltage conversion circuits shown in FIG. 9.

FIG. 9 is a diagram showing a construction in which an ideal amplifier 21 having a gain ratio of 1 is interposed between the first CR integrating circuit 3 and the second CR integrating circuit 14 in the voltage conversion circuit 20 shown in FIG. 6, and an ideal amplifier 301 having a gain ratio of 1 is interposed between the first CR integrating circuit 200 and the second CR integrating circuit 202 in the voltage conversion circuit 300. A reason why the ideal amplifiers 21 and 301 are interposed is to create a situation in which the load resistors (the second CR integrating circuits 14 and 202) can be considered as if they were not connected to the first CR integrating circuits 3 and 200. FIG. 10 is a diagram showing the output voltages from the output terminals 5 and 207 shown in FIG. 9. As shown in FIG. 10, a curve Vo-b of the output voltage in the embodiment and a curve Vo-a of the output voltage in the related art perfectly coincide with each other. This means that the first CR integrating circuit 3 of the embodiment is able to achieve the foregoing effects when the load resistor 4 is connected to the first CR integrating circuit 3.

Figure 11:
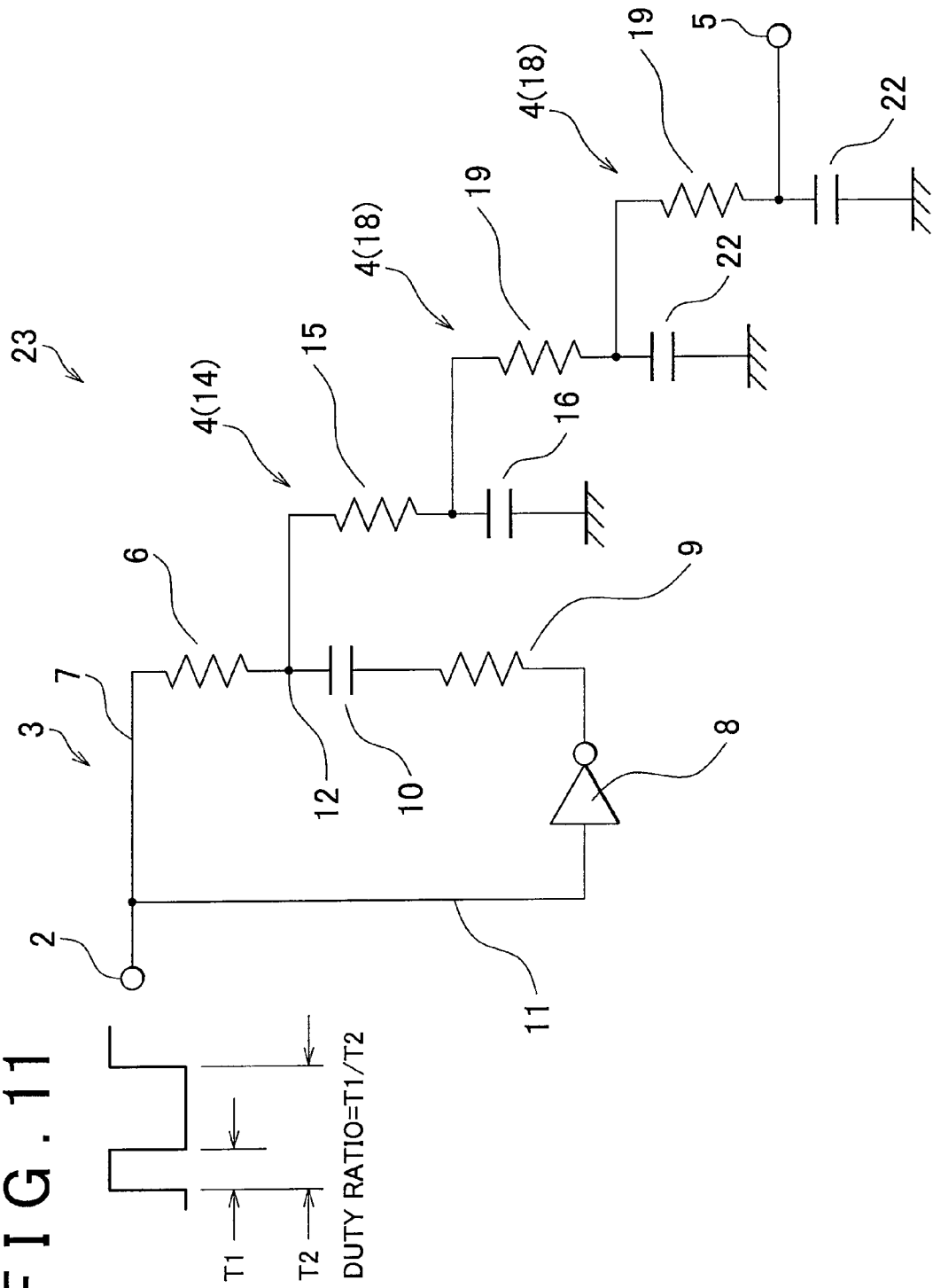
FIG. 11 is a diagram showing a duty ratio/voltage conversion circuit in accordance with a third embodiment of the invention.

[THIRD EMBODIMENT] A third embodiment of the invention will be described with reference to the drawings. FIG. 11 is a diagram showing a duty ratio/voltage conversion circuit in accordance with the third embodiment.

A duty ratio/voltage conversion circuit 23 in accordance with the third embodiment has a construction in which an N stage(s) (N is an arbitrary integer equal to or larger than 1) of third CR integrating circuits 18 are connected as stages that succeed to a second CR integrating circuit 14 that is the same as the second CR integrating circuit 14 in the second embodiment shown in FIG. 4, a resistor 19 of a third CR integrating circuit 18 that is the first stage from the input side (i.e., is adjacent to the second CR integrating circuit 14) is connected to a connecting point between a third resistor 15 and a second capacitor 16 of the second CR integrating circuit 14, and the resistor 19 of each of the third CR integrating circuits 18 of the second and succeeding stages is connected to a connecting point between the resistor 19 and a capacitor 22 of the third CR integrating circuit 18 of the preceding stage. Besides, an output terminal 5 is connected to a connecting point between the resistor 19 and the capacitor 22 of one of the N stage(s) of the third CR integrating circuits 18 which is positioned at the last stage (terminal end). In the example construction shown in FIG. 11, the integer N is set at 2. Incidentally, N may be set at 1, 3, 4, . . .

According to the third embodiment, the signal is averaged (flattened) by the second CR integrating circuit 14 and the third CR integrating circuit 18. Therefore, it is possible to obtain more stable output voltage from the output terminal 5.

Figure 12:
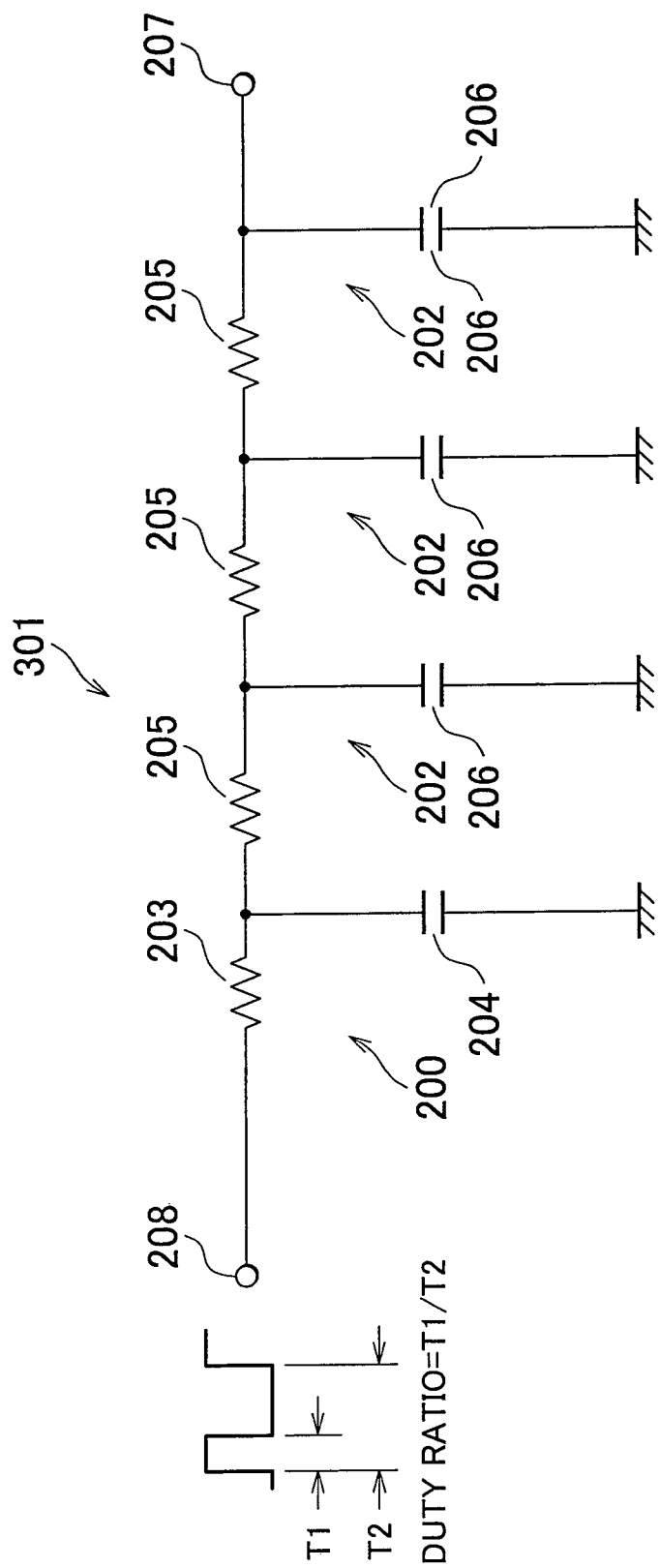
FIG. 12 is a diagram showing an example of the voltage conversion circuits in accordance with the related art.

In order to show the effects of the third embodiment, the third embodiment and a related-art technology are compared. FIG. 12 is a diagram showing an example of the voltage conversion circuits in accordance with the related art. A voltage conversion circuit 301 shown in FIG. 12 includes a circuit arrangement equivalent to the voltage conversion circuit 300 as show in FIG. 5, and second CR integrating circuits 202 provided as stages that succeed to the circuit arrangement.

In the related art shown in FIG. 5, one stage of a second CR integrating circuit 202 is connected to the capacitor 204 in parallel. On the other hand, the related-art voltage conversion circuit 301 shown in FIG. 12 is different from the related-art circuit shown in FIG. 5 in that a plurality of stages (three stages in the example arrangement shown in FIG. 12) of second CR integrating circuits 202 are connected to the capacitor 204 in parallel, but other constructions are substantially the same as those of the related art shown in FIG. 5. In the related-art circuit shown in FIG. 12, the first-stage second CR integrating circuit 202 includes a second resistor 205 that is connected at a first end thereof to an output point of a first CR integrating circuit 200, and a second capacitor 206 that is connected at a first end thereof to a second end of the second resistor 205 and that is grounded at a second end thereof. The second-stage second CR integrating circuit 202 includes a second resistor 205 that is connected at a first end thereof to an output point of the first-stage second CR integrating circuit 202 (i.e., a connecting point between the second resistor 205 and the second capacitor 206 in the first-stage second CR integrating circuit 202), and a second capacitor 206 that is connected at a first end thereof to a second end of the second resistor 205 and that is grounded at a second end thereof. The third and succeeding stages of second CR integrating circuits 202 are constructed in the same manner. As for the last-stage (third-stage in the example construction shown in FIG. 12) second CR integrating circuit 202, the connecting point between the second resistor 205 and the second capacitor 206 is connected to an output terminal 207.

Figure 13:
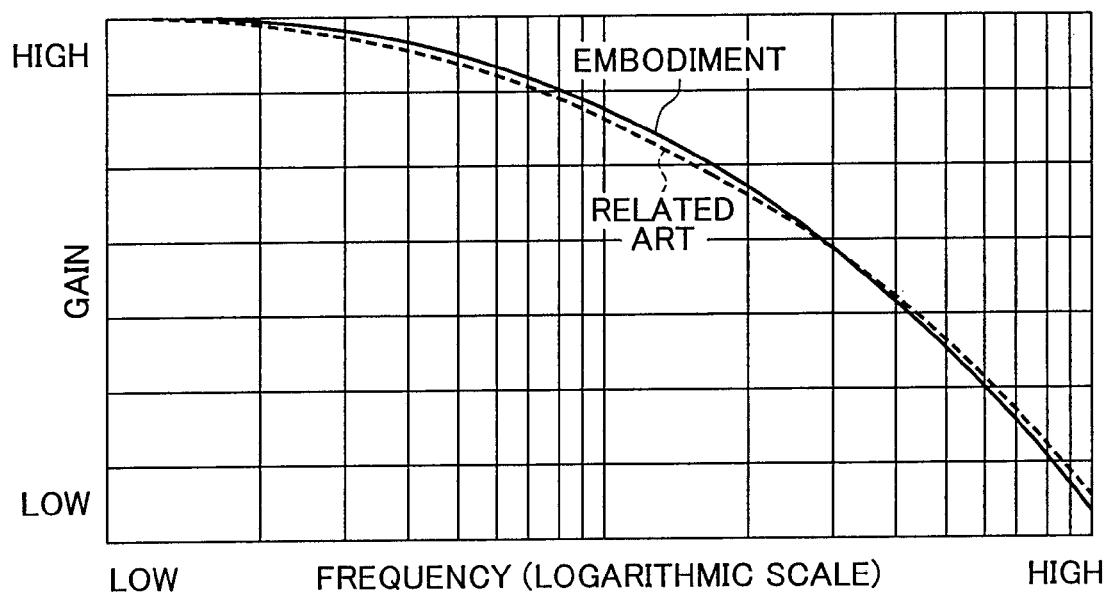
FIG. 13 is a diagram showing comparison between the gain of the output voltage of the circuit in accordance with the related art and the gain of the output voltage of the circuit in the third embodiment.

FIG. 13 is a diagram showing comparison between the gain of the output voltage in the related art and the gain of the output voltage in the third embodiment. As can be seen from FIG. 13, the embodiment is higher in the low-frequency gain and lower in the high-frequency gain than the related art. Hence, the embodiment is able to lessen the ripple of the output voltage and improve the response in comparison with the related-art duty ratio/voltage conversion circuit.

Figure 14:
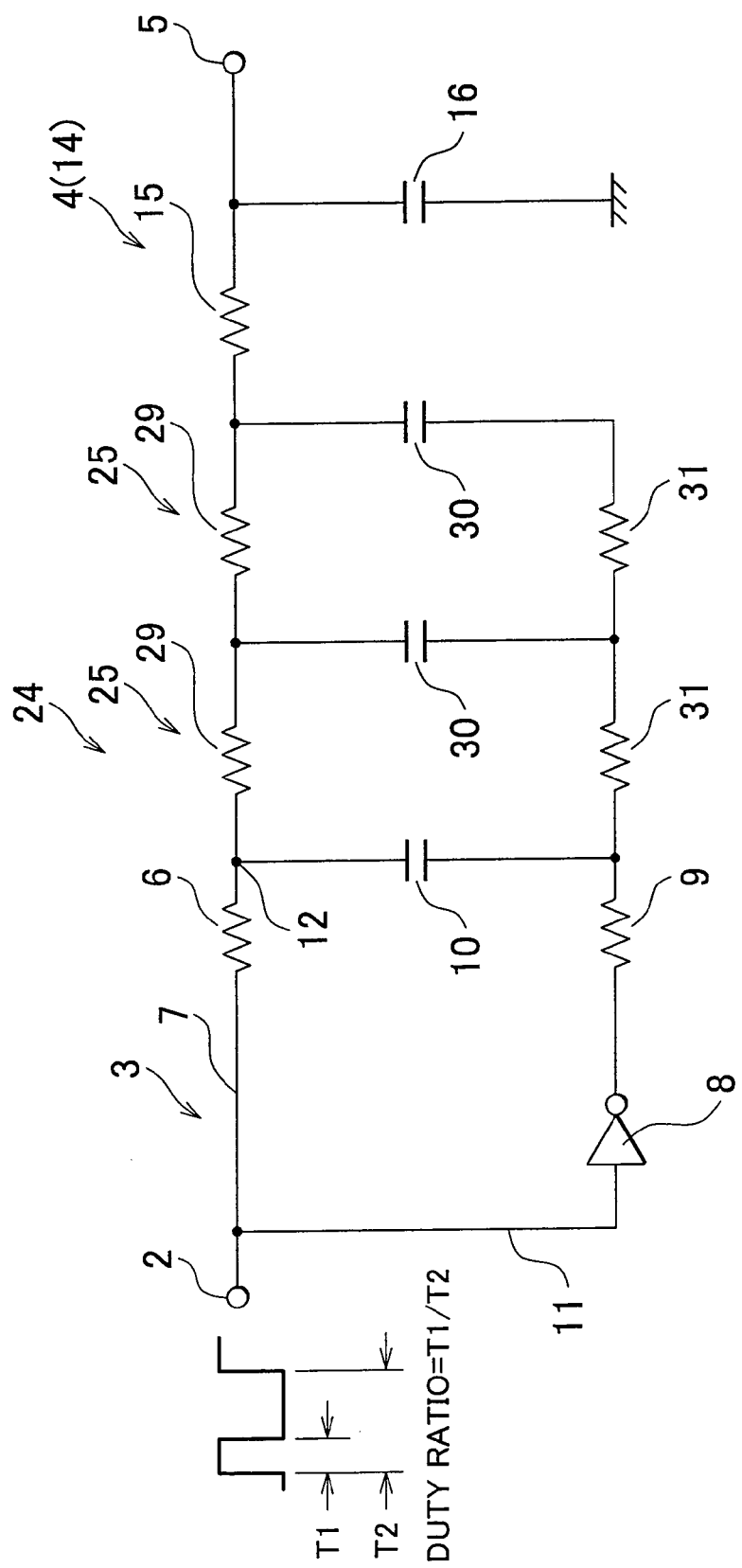
FIG. 14 is a diagram showing a duty ratio/voltage conversion circuit in accordance with a fourth embodiment of the invention.

[FOURTH EMBODIMENT] A fourth embodiment of the invention will be described with reference to the drawings. FIG. 14 is a diagram showing a duty ratio/voltage conversion circuit in accordance with the fourth embodiment.

In a duty ratio/voltage conversion circuit 24 in accordance with the fourth embodiment, a first end of a load resistor 4 (that is a second CR integrating circuit 14 in the example construction shown in FIG. 14) is connected to the output point 12 of a circuit arrangement equivalent to that of the first embodiment, via an M stage(s) (M is an arbitrary integer equal to or greater than 1) of fourth CR integrating circuits 25. Each fourth CR integrating circuit 25 has a construction in which a third resistor 29, a third capacitor 30 and a fourth resistor 31 are connected in series in that order. As for the first-stage fourth CR integrating circuit 25, a first end of the third resistor 29 is connected to the output point 12, and a first end of the fourth resistor 31 is connected to a connecting point between a first capacitor 10 and a second resistor 9. As for each of the second and succeeding stages of fourth CR integrating circuits 25, a first end of the third resistor 29 is connected to a connecting point between the third resistor 29 and the third capacitor 30 in the preceding-stage fourth CR integrating circuit 25, and a first end of the fourth resistor 31 is connected to a connecting point between the second capacitor 30 and the fourth resistor 31 in the preceding-stage fourth CR integrating circuit 25. Besides, the connecting point between the third resistor 29 and the third capacitor 30 in the last-stage fourth CR integrating circuit 25 is connected to a first end of the load resistor 4 (that is the second CR integrating circuit 14 in the example construction shown in FIG. 14). The fourth CR integrating circuits 25 are connected in parallel with the first capacitor 10.

In comparison with the related-art duty ratio/voltage conversion circuit 301 (see FIG. 12), the duty ratio/voltage conversion circuit of the fourth embodiment has larger output impedances of the first CR integrating circuit 3 and the fourth CR integrating circuits 25 in the high-frequency region of the input signal, and therefore is less apt to allow passage of a high-frequency component of the input signal (has a less high-frequency gain) provided that the time constant is equal between the two duty ratio/voltage conversion circuits. Besides, in comparison with the third embodiment, the fourth embodiment has a larger output impedance due to the output impedance of the fourth CR integrating circuit 25 in the high-frequency region of the input signal, and is even less apt to allow passage of the high-frequency component of the input signal (has an even less high-frequency gain) provided that the time constant is equal between the two embodiments. Therefore, the fourth embodiment is able to further lessen the ripple of the output voltage.

Figure 15:
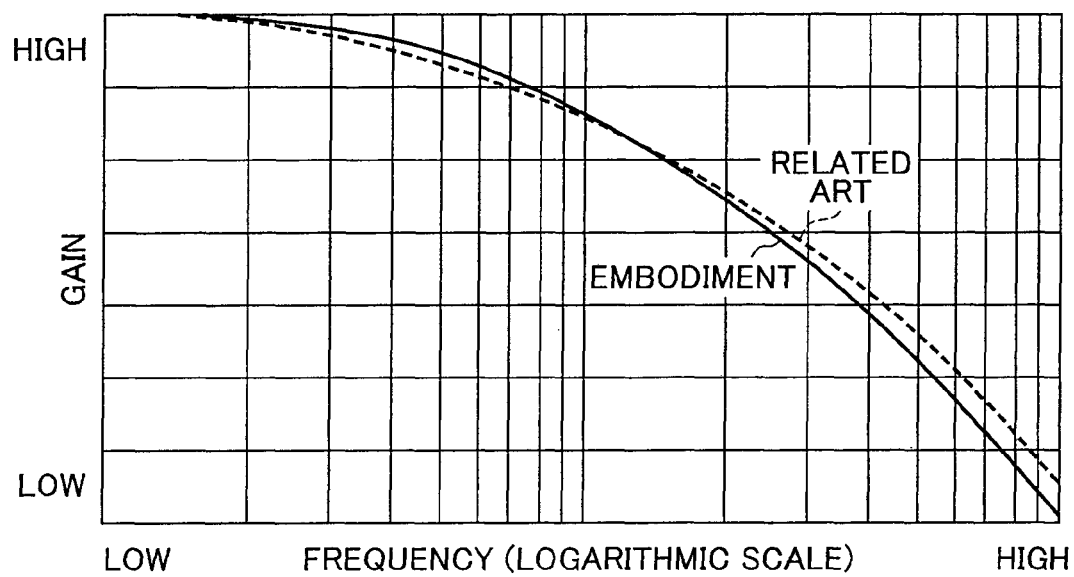
FIG. 15 is a diagram showing comparison between the gain of the output voltage of the related-art circuit shown in FIG. 12 and the gain of the output voltage of the circuit in the fourth embodiment.

FIG. 15 is a diagram showing comparison between the gain of the output voltage in the related art shown in FIG. 12 and the gain of the output voltage in the fourth embodiment. As can be seen from FIG. 15, the fourth embodiment is higher in the low-frequency gain and lower in the high-frequency gain than the related art. Besides, in comparison with the third embodiment, the fourth embodiment is lower in the high-frequency gain due to the output impedance of the fourth CR integrating circuit 25 in the high-frequency region of the input signal.

Figure 16:
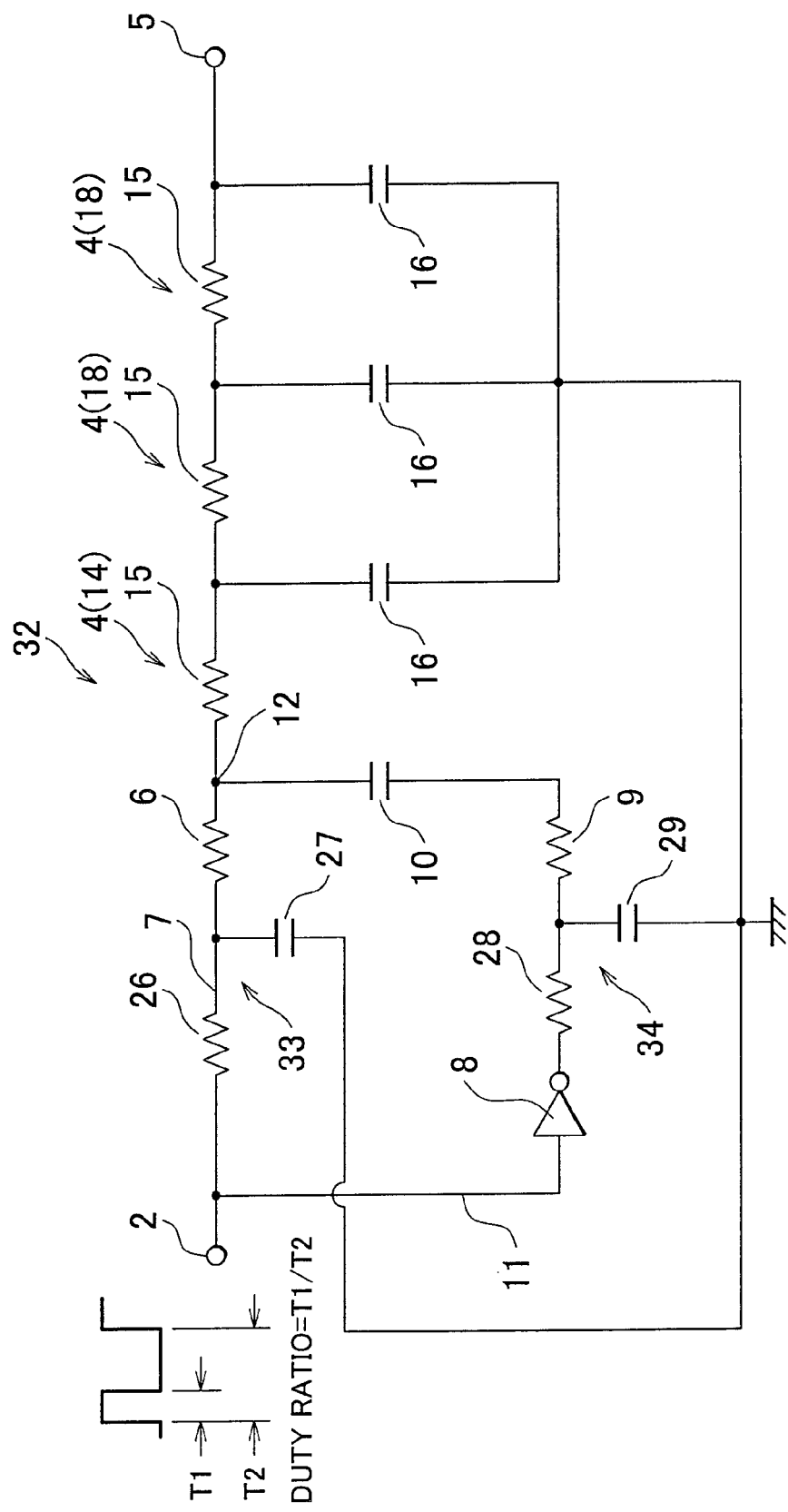
FIG. 16 is a diagram showing a duty ratio/voltage conversion circuit in accordance with a fifth embodiment of the invention.

[FIFTH EMBODIMENT] A fifth embodiment of the invention will be described with reference to the drawings. FIG. 16 is a diagram showing a duty ratio/voltage conversion circuit in accordance with the fifth embodiment.

A duty ratio/voltage conversion circuit 32 in accordance with the fifth embodiment is different from the duty ratio/voltage conversion circuit 23 in accordance with the third embodiment in that a fifth CR integrating circuit 33 is connected to an intermediate portion of a first pathway 7, and a sixth CR integrating circuit 34 is connected to an intermediate portion of a second pathway 11, and other constructions are substantially the same as those of the third embodiment. The fifth CR integrating circuit 33 includes a resistor 26 and a capacitor 27. A first end of the resistor 26 is connected to an input terminal 2, and a second end of the resistor 26 is connected to a first end of a first resistor 6. A first end of the capacitor 27 is connected to a connecting point between the resistor 26 and the first resistor 6, and a second end of the capacitor 27 is grounded. The sixth CR integrating circuit 34 includes a resistor 28 and a capacitor 29. A first end of the resistor 28 is connected to an output side of a phase inversion portion 8, and a second end of the resistor 28 is connected to a first end of a second resistor 9. A first end of the capacitor 29 is connected to a connecting point between the resistor 28 and the second resistor 9, and a second end of the capacitor 29 is grounded.

Figure 17A:
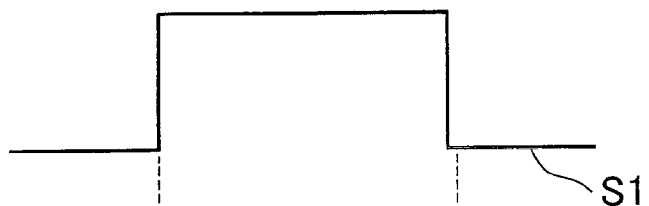
FIGS. 17A to 17D are diagrams for showing effects of the fifth embodiment in comparison with another embodiment.
Figure 17B:
Figure 17C:
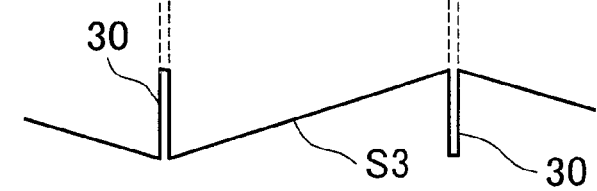
Figure 17D:

FIGS. 17A to 17D are diagrams for showing effects of the fifth embodiment in comparison with another embodiment. FIG. 17A shows a waveform of the input signal, and FIG. 17B shows a state in which the input signal is inverted by the phase inversion portion 8. FIG. 17C shows a multiplexed signal at the output point 12 in the other embodiment, and FIG. 17D shows a multiplexed signal at the output point 12 in the fifth embodiment in the case where the signal as shown in FIG. 17A is processed by the fifth CR integrating circuit 33 and the signal as shown in FIG. 17B is processed by the sixth CR integrating circuit 34.

Generally, the phase inversion portion 8 (i.e., a C-MOS inverter IC) has a predetermined time delay (a time needed for the phase inversion) between its input signal S1 (see FIG. 17A) and its output signal S2 (see FIG. 17B). Therefore, in the multiplexed signal S3 at the output point 12, there occurs a spike waveform 30 corresponding to the delay time as shown in FIG. 17C. Because there is possibility of a high-frequency component of the spike waveform 30 being radiated as noise, it is preferable that the spike waveform 30 be not generated. Therefore, the fifth CR integrating circuit 33 and the sixth CR integrating circuit 34 are provided.

According to the fifth embodiment, due to the provision of the fifth CR integrating circuit 33 and the sixth CR integrating circuit 34, even if the input signal S1 has a rectangular waveform as shown in FIG. 17A, the signals output by the fifth CR integrating circuit 33 and the sixth CR integrating circuit 34 have a form of gentle rise and gentle fall. Due to this, even if a time delay occurs in the output signal S2 of the phase inversion portion 8 as shown in FIG. 17B, it is possible to restrain the appearance of the spike waveform 30 in the sum of the output signal of the first pathway 7 and the output signal of the second pathway 11 (a multiplexed signal S4 at the output point 12) (see FIG. 17D).

Incidentally, although in the foregoing embodiments the input signal is a rectangular wave, the input signal is not limited to a rectangular wave. For example, the input signal may be a sine wave as shown in FIG. 18. In the case where the input signal is a sine wave signal, it suffices that a threshold value for determining whether the signal is at a high level or a low level is provided, and that the signal is determined as being at the high level if the signal level exceeds the threshold value, and that the signal is determined as being at the low level if the signal level is less than the threshold value. If the period of the sine wave is T2 and the high-level duration in each period is T1, T1/T2 is the duty ratio.

Figure 19:
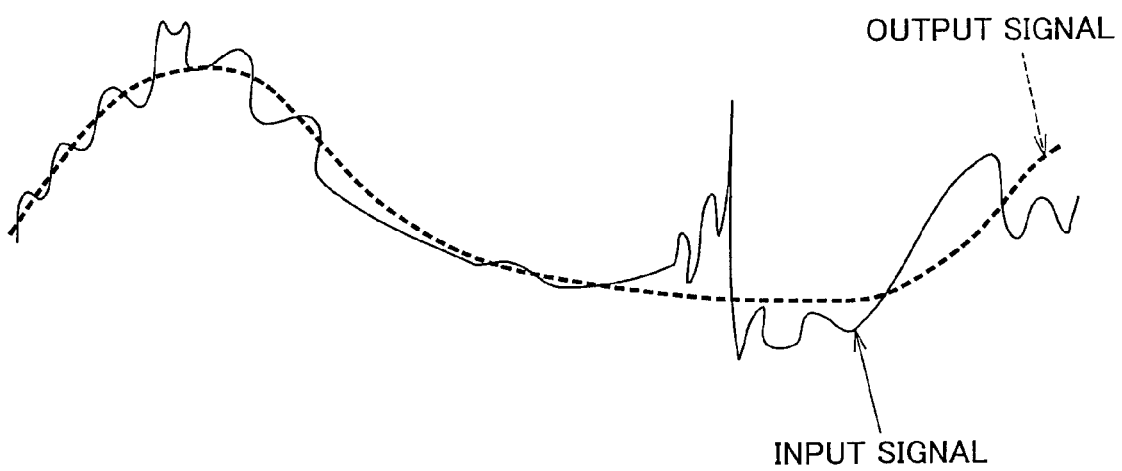
FIG. 19 is a diagram showing an output signal obtained by processing an input signal via a bypass filter in the case where the input signal is an analog signal that includes an arbitrary frequency component.

Besides, the input signal may be an analog signal that contains a component of an arbitrary frequency as shown in FIG. 19. In this case, the phase inversion portion as in the foregoing embodiments is a phase inversion portion that uses an operation amplifier or the like instead of a C-MOS inverter IC. Besides, the resistor and the capacitor are replaced with each other in each CR integrating circuit. This interchange of the resistor and the capacitor turns the CR integrating circuits into CR differentiation circuits. Due to this, the foregoing embodiments can be applied to bypass filters that are excellent in the shutting-off characteristic in low-frequency region.

The invention is applicable to duty ratio/voltage conversion circuits in which the ripple of the output voltage is lessened and the response is improved.

While the invention has been described with reference to example embodiments thereof, it is to be understood that the invention is not limited to the described embodiments or constructions. To the contrary, the invention is intended to cover various modifications and equivalent arrangements. In addition, while the various elements of the disclosed invention are shown in various example combinations and configurations, other combinations and configurations, including more, less or only a single element, are also within the scope of the appended claims.

The invention claimed is:

1. A duty ratio/voltage conversion circuit that converts a duty ratio of an input signal into a voltage level and outputs the voltage level, the duty ratio/voltage conversion circuit comprising:
   an input terminal to which the input signal is input;
   a first CR integrating circuit that integrates the input signal from the input terminal;
   load means, a first end of which is directly or indirectly connected to an output point of the first CR integrating circuit, and a second end of which is grounded; and
   an output terminal connected to the load means,
   wherein the first CR integrating circuit includes a first pathway that has a first resistor, and a second pathway that has a phase inversion portion, a second resistor and a first capacitor that are connected in series, and the first CR integrating circuit is a parallel circuit in which a first end and a second end of the first pathway are connected to a first end and a second end, respectively, of the second pathway, and wherein a connecting point between the first end of the first pathway and the first end of the second pathway is connected to the input terminal, and a connecting point between the second end of the first pathway and the second end of the second pathway is the output point of the first CR integrating circuit.

2. The duty ratio/voltage conversion circuit according to claim 1, wherein the phase inversion portion, the second resistor and the first capacitor in the second pathway are connected in series in the recited order from the input terminal.

3. The duty ratio/voltage conversion circuit according to claim 1, wherein the load means is a load resistor.

4. The duty ratio/voltage conversion circuit according to claim 3, wherein:
   A first end of the load resistor is connected to the output point via an M stage(s) (M is an arbitrary integer equal to or greater than 1) of fourth CR integrating circuits;
   each of the fourth CR integrating circuit is connected to the fist capacitor in parallel, and each fourth CR integrating circuit has a construction in which a capacitor is connected between resistors in series; and
   a first end of the load resistor is connected to a connecting pint between the capacitor and one of the resistors of the fourth CR integrating circuit positioned at a terminal stage, of the M stage(s) of the fourth CR integrating circuits.

5. The duty ratio/voltage conversion circuit according to claim 1, wherein the load means is a second CR integrating circuit that integrates a signal sent from the output point.

6. A duty ratio/voltage conversion circuit according to claim 5, wherein the second CR integrating circuit includes a third resistor a first end of which is connected to the output point, and the second capacitor a first end of which is connected to a second end of the third resistor, and a second end of which is grounded, and a connecting point between the third resistor and the second capacitor is connected to the output terminal.

7. The duty ratio/voltage conversion circuit according to claim 5, wherein:
   an N stage(s) (N is an arbitrary integer equal to or greater than 1) of third CR integrating circuits are connected to the second CR integrating circuit as stages that succeed to the second CR integrating circuit;
   a first end of the third CR integrating circuit that is of the first stage in an order of connection from a side of the input terminal is connected to a connecting point between the third resistor and the second capacitor of the second CR integrating circuit;
   a first end of the capacitor of the third CR integrating circuit of the first stage in the order of connection from the side of the input terminal is connected to a second end of the third CR integrating circuit of the first stage in the order of connection from the side of the input terminal;
   a second end of the capacitor of the third CR integrating circuit of the first stage in the order of connection from the side of the input terminal is grounded;
   a first end of the resistor of each one of the third CR integrating circuits of the second and succeeding stages in the order of connection is connected to a connecting point between the resistor and the capacitor of a preceding one of the third CR integrating circuits;
   a first end of the capacitor of each one of the third CR integrating circuits of the second and succeeding stages is connected to a second end of the resistor of the third CR integrating circuit of the same stage; and
   a second end of the capacitor of each one of the third CR integrating circuits of the second and succeeding stages is grounded.

8. The duty ratio/voltage conversion circuit according to claim 7, wherein the output terminal is connected to the connecting point between the resistor rand the capacitor of the third CR integrating circuit positioned at a terminal stage in the order of connection, of the N stage(s) of the third CR integrating circuits.

9. The duty ratio/voltage conversion circuit according to claim 1, wherein:
   a fifth CR integrating circuit is connected to an intermediate portion of the first pathway, and a sixth CR integrating circuit is connected to an intermediate portion of the second pathway;
   a first end of a resistor of the fifth CR integrating circuit is connected to the input terminal, and a second end of the resistor of the fifth CR integrating circuit is connected to a first end of the first resistor;
   a first end of a capacitor of the fifth CR integrating circuit is connected to a connecting portion between the resistor of the fifth CR integrating circuit and the first resistor, and a second end of the capacitor of the fifth CR integrating circuit is grounded;
   a first end of a resistor of the sixth CR integrating circuit is connected to an output side of the phase inversion portion, and a second end of the resistor of the sixth CR integrating circuit is connected to a first end of the second resistor; and
   a first end of a capacitor of the sixth CR integrating circuit is connected to a connecting portion between the resistor of the sixth CR integrating circuit and the second resistor, and a second end of the capacitor of the sixth CR integrating circuit is grounded.

10. A duty ratio/voltage conversion circuit that converts a duty ratio of an input signal into a voltage level and outputs the voltage level, the duty ratio/voltage conversion circuit comprising:
    an input terminal to which the input signal is input;
    a first CR integrating circuit that integrates the input signal from the input terminal;
    a load, a first end of which is directly or indirectly connected to an output point of the first CR integrating circuit, and a second end of which is grounded; and
    an output terminal connected to the load,
    wherein the first CR integrating circuit includes a first pathway that has a first resistor, and a second pathway that has a phase inversion portion, a second resistor and a first capacitor that are connected in series, and the first CR integrating circuit is a parallel circuit in which a first end and a second end of the first pathway are connected to a first end and a second end, respectively, of the second pathway, and wherein a connecting point between the first end of the first pathway and the first end of the second pathway is connected to the input terminal, and a connecting point between the second end of the first pathway and the second end of the second pathway is the output point of the first CR integrating circuit.

11. The duty ratio/voltage conversion circuit according to claim 10, wherein the phase inversion portion, the second resistor and the first capacitor in the second pathway are connected in series in the recited order from the input terminal.

12. The duty ratio/voltage conversion circuit according to claim 10, wherein the load is a load resistor.

13. The duty ratio/voltage conversion circuit according to claim 10, wherein the load is a second CR integrating circuit that integrates a signal sent from the output point.

14. The duty ratio/voltage conversion circuit according to claim 13, wherein the second CR integrating circuit includes a third resistor a first end of which is connected to the output point, and a second capacitor a first end of which is connected to a second end of the third resistor, and a second end of which is grounded, and a connecting point between the third resistor and the second capacitor is connected to the output terminal.

15. The duty ratio/voltage conversion circuit according to claim 13, wherein:
    an N stage(s) (N is an arbitrary integer equal to or greater than 1) of third CR integrating circuits are connected to the second CR integrating circuit as stages that succeed to the second CR integrating circuit;
    a first end of the third CR integrating circuit that is of the first stage in an order of connection from a side of the input terminal is connected to a connecting point between the third resistor and the second capacitor of the second CR integrating circuit;
    a first end of the capacitor of the third CR integrating circuit of the first stage in the order of connection from the side of the input terminal is connected to a second end of the third CR integrating circuit of the first stage in the order of connection from the side of the input terminal;
    a second end of the capacitor of the third CR integrating circuit of the first stage in the order of connection from the side of the input terminal is grounded;
    a first end of the resistor of each one of the third CR integrating circuits of the second and succeeding stages in the order of connection is connected to a connecting point between the resistor and the capacitor of a preceding one of the third CR integrating circuits;
    a first end of the capacitor of each one of the third CR integrating circuits of the second and succeeding stages is connected to a second end of the resistor of the third CR integrating circuit of the same stage; and
    a second end of the capacitor of each one of the third CR integrating circuits of the second and succeeding stages is grounded.

16. The duty ratio/voltage conversion circuit according to claim 15, wherein the output terminal is connected to the connecting point between the resistor and the capacitor of the third CR integrating circuit positioned at a terminal stage in the order of connection, of the N stage(s) of the third CR integrating circuits.

17. The duty ratio/voltage conversion circuit according to claim 10, wherein:
    a first end of the load resistor is connected to the output point via an M stage(s) (M is an arbitrary integer equal to or greater than 1) of fourth CR integrating circuits;
    each of the fourth CR integrating circuits is connected to the first capacitor in parallel, and each fourth CR integrating circuit has a construction in which a capacitor is connected between resistors in series; and
    a first end of the load resistor is connected to a connecting point between the capacitor and one of the resistors of the fourth CR integrating circuit positioned at a terminal stage, of the M stage(s) of the fourth CR integrating circuits.

18. The duty ratio/voltage conversion circuit according to claim 10, wherein:
    a fifth CR integrating circuit is connected to an intermediate portion of the first pathway, and a sixth CR integrating circuit is connected to an intermediate portion of the second pathway;
    a first end of a resistor of the fifth CR integrating circuit is connected to the input terminal and a second end of the resistor of the fifth CR integrating circuit is connected to a first end of the first resistor;
    a first end of a capacitor of the fifth CR integrating circuit is connected to a connecting portion between the resistor of the fifth CR integrating circuit and the first resistor, and a second end of the capacitor of the fifth CR integrating circuit is grounded;
    a first end of a resistor of the sixth CR integrating circuit is connected to an output side of the phase inversion portion, and a second end of the resistor of the sixth CR integrating circuit is connected to a first end of the second resistor; and
    a first end of a capacitor of the sixth CR integrating circuit is connected to a connecting portion between the resistor of the sixth CR integrating circuit and the second resistor, and a second end of the capacitor of the sixth CR integrating circuit is grounded.

* * * * *